United States Patent [19]

Blankenship et al.

[11] Patent Number: 5,278,728
[45] Date of Patent: Jan. 11, 1994

[54] DIODE MOUNTING

[75] Inventors: George D. Blankenship, Chardon; Kenneth L. Justice, Wickliffe, both of Ohio

[73] Assignee: The Lincoln Electric Company, Cleveland, Ohio

[21] Appl. No.: 904,476

[22] Filed: Jun. 25, 1992

[51] Int. Cl.$^5$ .............. H05K 7/06; H05K 1/11; H01R 23/68; H01R 11/00
[52] U.S. Cl. .................. 361/807; 257/733; 257/773; 439/74; 439/78; 439/83; 439/845; 439/849; 439/850; 361/744; 361/760; 361/761; 361/784; 361/785
[58] Field of Search ............ 439/74, 78, 83, 845, 439/849, 850; 361/396, 400, 406, 408, 412, 413, 401, 417, 419, 420, 426, 430, 432; 257/910, 698, 727, 733, 773; 174/266, 267

[56] References Cited

U.S. PATENT DOCUMENTS

| | | | |
|---|---|---|---|
| 1,862,811 | 6/1932 | Strong | 361/426 |
| 2,886,747 | 5/1959 | Diebold | 257/733 |
| 3,950,778 | 4/1976 | Pomper et al. | 257/733 |

FOREIGN PATENT DOCUMENTS

| | | | |
|---|---|---|---|
| 1159100 | 12/1963 | Fed. Rep. of Germany | 257/727 |
| 0064131 | 8/1949 | Netherlands | 361/426 |
| 0834000 | 5/1960 | United Kingdom | 257/727 |

Primary Examiner—Leo P. Picard
Assistant Examiner—Donald A. Sparks
Attorney, Agent, or Firm—Body, Vickers & Daniels

[57] ABSTRACT

A mounting assembly for a plurality of bipolar electrical components connected between two generally parallel electrical supports, each bipolar electrical component having a lower base terminal fixedly mounted to the first electrical support and a generally flat upper terminal having a random angular orientation about the central axis of the electrical components, an electrically conducting coupler which telescopically receives the upper terminal of the component to form a rigid electrical connection between the coupler and an electrical component at one end of the coupler and the other end of the coupler is electrically connected to the second electrical support.

22 Claims, 3 Drawing Sheets

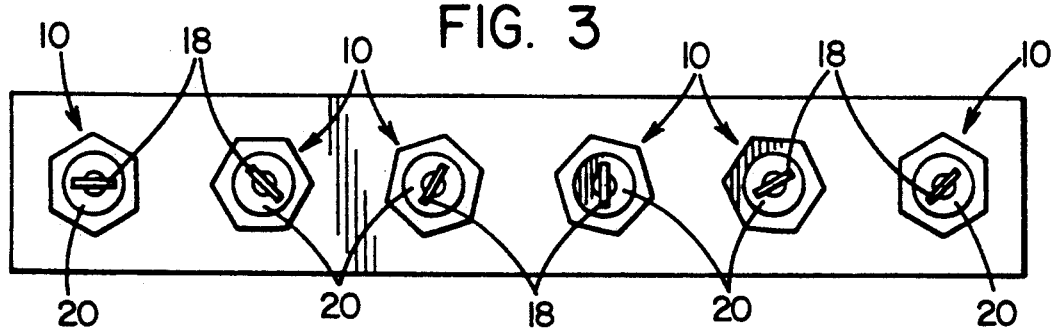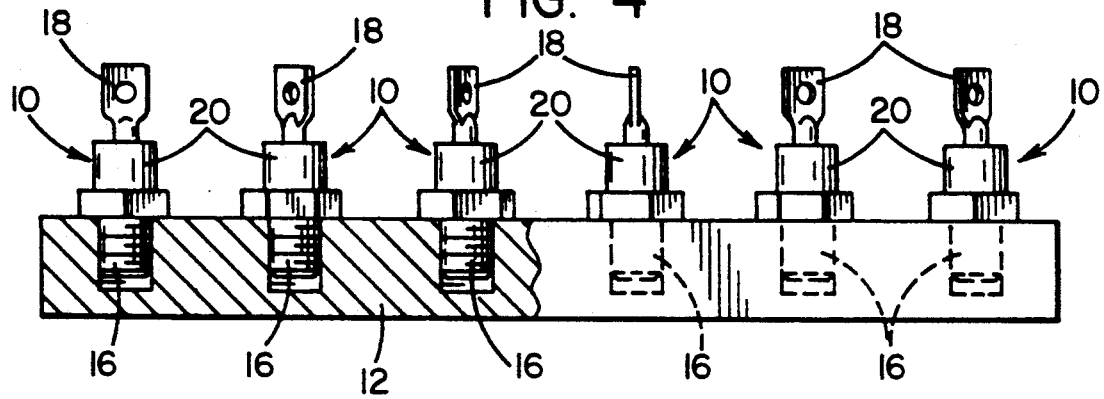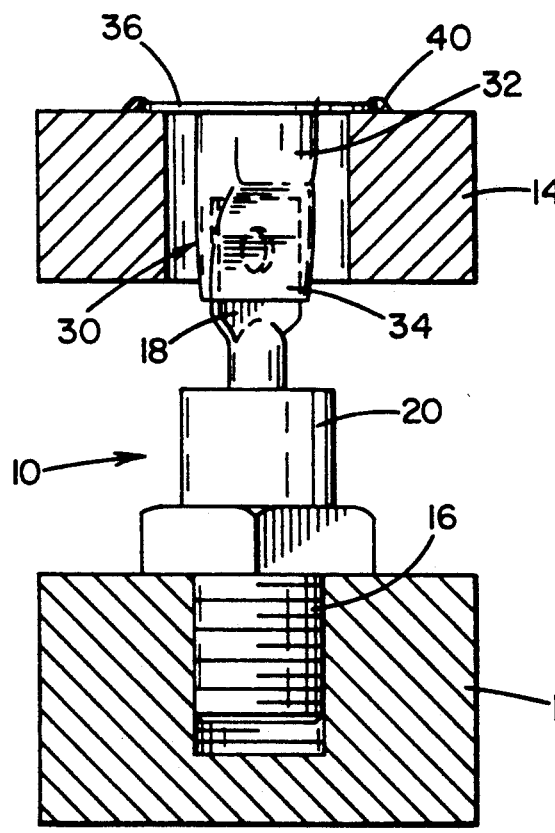

DIODE MOUNTING

This invention relates to the art of mounting semiconducting components in electrical circuits and more particularly to an improved diode mounting assembly for mounting diodes between two electrical supports.

BACKGROUND OF THE INVENTION

The present invention is particularly applicable to mounting a number of diodes between two spaced electrical supports and it will be discussed with particular reference thereto; however, the invention has broader applications and may be used to mount various electrical components between two mounting structures where the components have random orientation, but require a controlled mounting orientation. Semiconducting devices, such as diodes, are commonly used in all types of electrical circuits. The semiconducting component of a diode is typically composed of a crystalline, silicon structure resembling a form of glass. These glass type structures are very fragile and can be easily broken when mounted onto an electrical circuit. The diodes in a circuit for a power source are normally connected between two electric supports or bus bars. The bipolar diode has two terminal ends, an anode terminal and a cathode terminal. The cathode terminal of the diode is typically a solid metal structure attached to the metal casing about the diode. The anode terminal of the diode typically is a flat bladed terminal. The flat bladed terminal also may have a hole in the face of the terminal so that a wire may be easily inserted and attached between the anode terminal and the electrical support. The anode terminal is connected directly to the silicon semiconducting crystalline component of the diode. As a result, the anode terminal of the diode is very fragile and cannot be twisted or moved without possible damage to the semiconducting component in the diode. During assembly, the cathode terminal is first inserted into the negative electrical support of the circuit by screwing, soldering or welding the terminal end to the electrical support. Once the diode has been secured into the negative electrical support the anode terminal of the diode is then connected to the positive electrical support to complete the circuit. A wire is normally inserted into the hole in the flat bladed anode terminal and soldered to the terminal and the other end of the wire is soldered to the positive electrical support. This assembly procedure is quite expensive. During the procedure of mounting the anode terminal of the diode, damage to the crystalline silicon semiconducting component can occur unless special precautions are taken by the worker performing the assembly procedure. Damage can result from moving the terminal while trying to insert and solder the wire end to the terminal since the crystalline structure is very fragile and any small movement to the anode terminal results in damage to the crystalline structure. Damage to the crystalline structure may also occur during the soldering of the wire to the anode terminal. The high temperatures resulting from the soldering of the wire may melt and/or structurally damage the semiconducting silicon material. The process of connecting a wire to the diode without damaging the semiconducting material complicates the assembly of the circuit. Presently there is no easy method of connecting both the anode and cathode terminals of the diode to the respective electrical supports. Prefabricated slots can be formed in one or more of the electrical supports to receive both of the terminals. However, complications result in this assembly method since the diode when threaded or welded at one end requires the other terminal end to be exactly aligned with the prefabricated slots in the electrical support. Due to the problems and expense associated with this method, manufacturers typically avoid this method and use the standard practice of soldering one wire end to the anode terminal of the diode and soldering the other wire end to the electrical support.

THE INVENTION

The present invention contemplates a new and improved method of mounting a bipolar component, such as a diode, between a positive and negative electrical support, which overcomes all of the above referred to problems and others and provides a mount which may be rapidly and economically manufactured and significantly reduces the chance of damaging the bipolar component during the mounting and simplifies the mounting of the bipolar component between the two electrical supports.

In accordance with a principal feature of the present invention, there is provided an improved mounting assembly for a plurality of bipolar electrical components between two electrical supports. Each of the bipolar electrical components has a lower base terminal and an upper terminal which typically lie along the central axis of the component. In accordance with the present invention, there is means for mounting the lower base terminal to one of the electrical supports. The base terminal is threaded and screwed into a threaded opening in the receiving electrical support. However, the base terminal may be welded, soldered, glued, bolted or mounted by other means to fixedly mount the base terminal to the electrical support. The shape of the upper terminal of the bipolar electrical component commonly has a flat bladed configuration. However, the upper terminal is not limited to a flat bladed form and may be any configuration. The angular orientation of the upper terminal about the central axis of the bipolar component after the base terminal is mounted is random. An electrically conducting coupler is provided to connect the bipolar component upper terminal to the other electrical support. The electrical supports are generally parallel to each other. The coupler has a connector means which telescopically fits about the upper terminal and forms an electrical connection between the coupler and the upper terminal. The coupler also has a conducting body which connects the connector means to the coupler mounting plate. The mounting plate generally has a width greater than the connecting means or the conducting body. The mounting plate is designed to engage and be secured to the other electrical support to form an electrical connection between the coupler and the electrical support. Generally the mounting plate is soldered to the electrical support, but may be welded, glued or connected by any other means so as to form a rigid electrical connection. The coupler is generally made of copper which is a highly conductive material; however, the coupler material can be any conducting material.

In accordance with another feature of the present invention, the coupler connecting means and conducting body are inserted through the electrical support. The electrical support is generally designed to contain openings to receive various electrical devices. The openings may or may not be threaded and may vary in size. The openings in the electrical support that receive the coupler has a width large enough to allow the coupler connecting means and connector body to pass but may or may not be large enough to allow the mounting plate to pass through the opening. Before the coupler can be completely inserted through the electrical support opening, the coupler must be rotated so as to align the connecting means with the bipolar component upper terminal. The alignment of the coupler to the upper terminal is necessary sine the angular orientation of the upper terminal about the central axis of the bipolar electrical component is random. The random orientation of the upper terminal is caused by several factors. During assembly of the bipolar component, the angular orientation is slightly different from component-to-component. Furthermore, if the base terminal is threaded, the point of threading typically is different with each component. The threaded holes in the electrical supports may also vary from hole-to-hole. Welding or gluing each component will also cause a slightly differnt orientation of the upper terminal. As a result of the random orientation, when a plurality of electrical components are in place to be mounted with the coupler, each coupler must be aligned separately since the angular orientation of each upper terminal of each coupler is different. Once the coupler is rotated and aligned, the coupler is positioned through the electrical support opening while the coupler connecting means simultaneously fits about the upper terminal. The insertion of the coupler is complete when the mounting plate engages the surface of the electrical support, thus completing the electrical connecting between the upper terminal and electrical support.

In accordance with another aspect of the present invention, the coupler connection means has a similar shape to the shape of the bipolar component upper terminal. The upper terminal is usually a flat blade shaped terminal. The coupler connection means has a blade shaped inlet to receive the flat blade shaped terminal. Such a design forms a rigid connection between the terminal and the coupler. The width of the inlet is designed to be the same size or slightly smaller than the width of the upper terminal so that a secure electrical connection is made. If the connector means inlet width is smaller than the upper terminal width, the coupler material should be made of a pliable material which can slightly deform and not damage the crystalline semiconducting material during insertion. Materials such as copper and aluminum are pliable enough to slightly deform about the upper terminal during insertion into the coupler while maintaining a rigid electrical connection.

The principal object of the present invention is to provide an improved mounting assembly and method for mounting a plurality of bipolar electrical components between two electrical supports.

Another object of the present invention is to provide an improved mounting assembly which includes an electrical coupler having a connection means which telescopically fits about one terminal of the bipolar component and a mounting plate which is attached to one of the electrical supports.

Yet another object of the present invention is to provide an improved mounting assembly which includes a coupler that can electrically connect a randomly angular oriented terminal of a bipolar component to an electrical support.

A further object of the present invention is to provide an improved mounting assembly which mounts the bipolar component to the electrical supports without damaging the semiconducting material in the component.

Still a further object of the invention is the provision of a coupler, as defined above, which coupler removes random orientation as a factor in assembly of a plurality of bipolar components between two electrical supports.

These and other objects and advantages will become apparent from the following description used to illustrate the preferred embodiment of the invention when read in conjunction with the accompanying drawings.

BRIEF DESCRIPTION OF THE DRAWINGS

FIG. 3 is a top view of a plurality of bipolar components connected to an electrical support at the base terminals;

FIG. 4 is a side view of the bipolar components of FIG. 3;

FIG. 5 is a side view of the bipolar component connected to the coupler;

PREFERRED EMBODIMENT OF THE INVENTION

Figure 1:
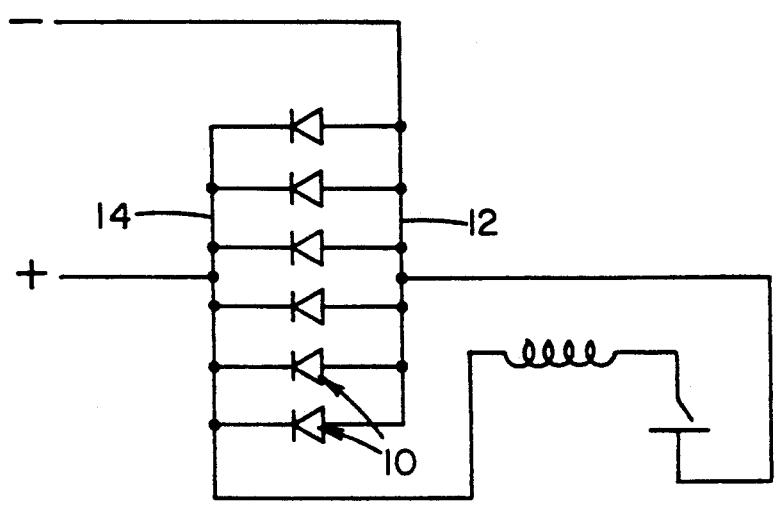
FIG. 1 is a view of a plurality of bipolar components connected between two electrical supports.

Referring now to the preferred embodiment of the invention only, and not for the purpose of limiting the same, FIG. 1 shows a typical power circuit for a welder wherein a plurality of bipolar components are connected between a first electrical support 12 and a second electrical support 14. The electrical supports are generally spaced parallel to one another as shown in the circuit diagram. The specific type of bipolar components shown in the circuit are diodes.

Figure 2:
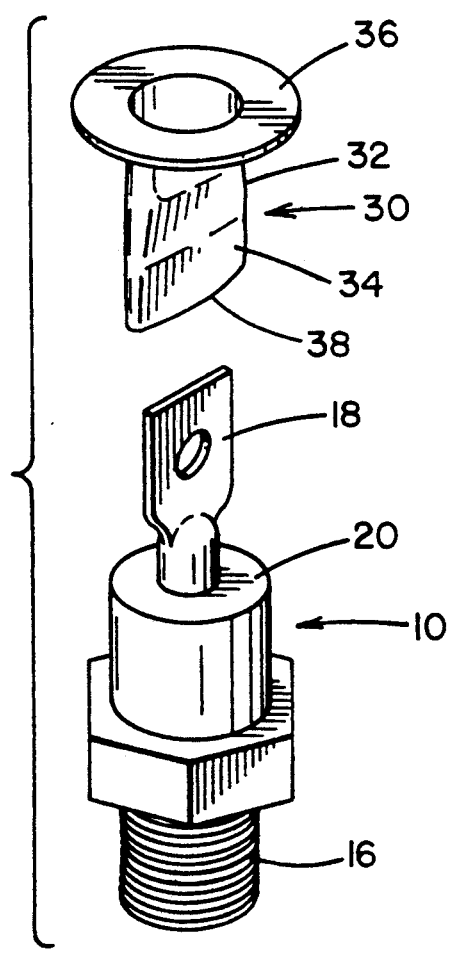
FIG. 2 is a side view of a bipolar component and a coupler.
Figure 6:
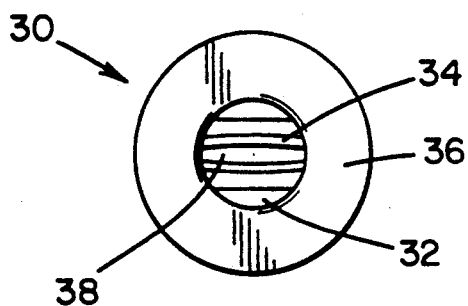
FIG. 6 is a top view of the coupler.
Figure 7:
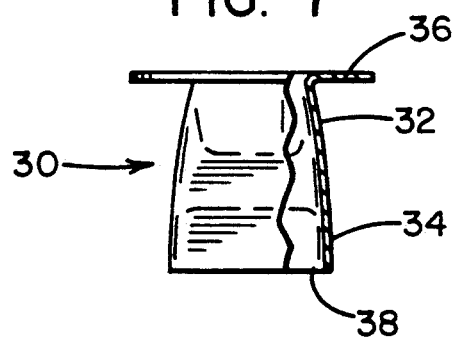
FIG. 7 is a side view of the diode coupler.
Figure 8:
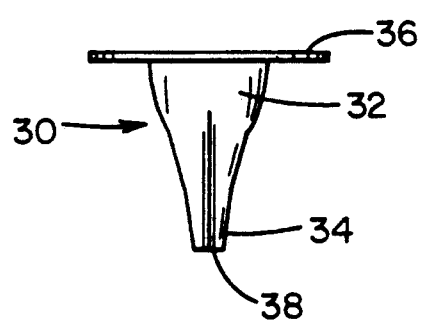
FIG. 8 is another side view of the coupler.
Figure 9:
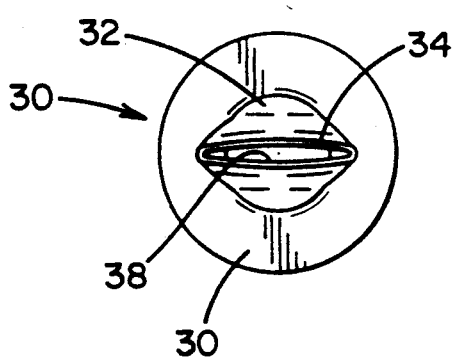
FIG. 9 is a bottom view of the coupler.

FIG. 2 illustrates a typical diode 10 having a base terminal 16, an upper terminal 18 and a semiconducting component 20 attached between the two terminals and an electrical coupler 30. Both base terminal 16 and upper terminal 18 are generally attached on diametrically opposite sides of semiconducting component 20 and both lie along the central axis of diode 10. Upper terminal 18 typically has a flat blade shape; however, the shape of upper terminal 18 may vary in shape.

Diode base terminal 16 has a mounting means for fixedly mounting diode 10 to first electrical support 12. The mounting means preferably is of the form of a threaded base terminal 16 which can be screwed into a threaded hole in first electrical support 12. Diode 10 is screwed into first electrical support 12 until securely mounted and forms a solid electrical connection. The mounting means is not limited to a threaded terminal and may also include other means such as welding, soldering, clamping, bolting, gluing, etc.

When mounting diode 10 to first electrical support 12, the angular orientation about the central axis of each diode mounted will be slightly different from diode to diode. This random orientation is readily apparent from diodes having a threaded base terminal 16. When a threaded diode 10 is screwed into first electrical support 12, the point diode 10 begins to screw into electrical support 12 is slightly different for each diode. As a result, the final screwed in position of each diode 12 is slightly different. If diode 10 has a flat blade shaped upper terminal 18, the angular orientation of the flat blade relative to the diode central axis will vary from diode to diode. As a result, a plurality of diodes will each typically have a different angular orientation to one another, as illustrated in FIGS. 3 and 4. Due to the random angular orientation of each upper terminal 18, the prefabrication of a second electrical support having openings to receive and form rigid electrical connection with randomly oriented upper terminal 18 becomes infeasible, especially when two or more diodes are to be connected.

Coupler 30, as illustrated in FIGS. 2, 6-9, is formed of an electrically conducting material and has a conducting body 32 electrically attached between coupler connecting means 34 and coupler mounting plate 36. Coupler 30 is preferably made of copper since copper is a highly electrically conductive material. Other materials such as aluminum, brass, iron and other electrically conducting materials may be used. A good electrical conductor is recommended since materials with high resistance to current will heat up when current passes through the material. The generated heat may be transferred to diode 10 and cause damage to the semiconducting component 20.

Coupler connecting means 34 is designed to form a rigid electrical connection with coupler upper terminal 18. Connecting means 34 has an opening 38 designed to telescopically receive coupler upper terminal 18. The width of opening 38 is preferably smaller than or equal to the width of flat bladed upper terminal. An opening in the connecting means 34 having a width greater than the width of flat bladed upper terminal 18 results in a loose electrical connection which can cause a short circuit between coupler 30 and diode 10. An opening 38 with a width significantly smaller than flat bladed upper terminal 18 will prevent connection means 34 from being fitted about upper terminal 18. If the width of opening 38 is slightly smaller than the width of upper terminal 18, connection means 34 should be composed of a material which can deform and/or bend so that opening 38 can expand when inserting upper terminal 18 into coupler connecting means 34 without damaging semiconducting component 20. Pliable metals such as copper are ideal for this type of connecting means design. The electrical connection between coupler 30 and upper terminal 18 is maximized when the shape of opening 38 is similar to the shape of upper terminal 18. The rigidity of connection between coupler 30 and upper terminal 18 is also maximized by shaping opening 38 similarly to the shape of upper terminal 18. The connection formed between connector means 34 and upper terminal 18 is such that additional securing means such as soldering, welding, clamping, gluing, etc. are not necessary before the rigid electrical connection is complete. However, these additional securing means may be used if desired but add little if any advantages to the connection between coupler 22 and diode 10. If such additional securing means are used, such as soldering or welding, care must be taken so as not to damage semiconducting component 20.

Coupler mounting plate 36 forms an electrical connection with second electrical support 14. The mounting plate is typically circular in shape and has a diameter greater than or equal to the width of coupler conducting body 32. Preferably, the diameter of mounting plate 36 is greater than the width of conducting body 32 and connecting means 34. Mounting plate 36 is made of an electrically conducting material to allow current to readily flow from conducting body 32 to second electrical support 14. Preferably, copper is used as the material for mounting plate 36.

After diode 10 is mounted into first electrical support 12, second electrical support 14 is placed generally parallel to the first electrical support in preparation of connecting diode 10 to second electrical support 14. In the preferred assembly, the second electrical support 14 contains holes wherein each hole is aligned with upper terminal end 18. Base terminal 16 and upper terminal 18 of diode 10 typically are aligned along the central axis of diode 10. First and second electrical supports 12 and 14 can have holes simultaneously drilled so as to pre-align upper terminal 18 with second electrical support 14. This significantly simplifies the assembly and the cost of making electrical supports. Once second electrical support 14 is properly aligned with upper terminal 18, coupler connecting means 34 and coupling conducting body 32 are inserted into the hole of second electrical support 14. Prior to inserting connecting means 34 and conducting body 32 completely through the hole in second electrical support 14, coupler 30 is rotated until connecting means 34 aligns with flat bladed upper terminal 18. The amount of rotation of each coupler 30 will vary from diode to diode since each upper terminal 18 is randomly oriented about each central axis of the respective diode. Once connecting means 34 is properly aligned, insertion of coupler 30 is continued until mounting plate 36 engages the surface of second electrical support 14. As coupler 30 is further inserted after alignment, connecting means 34 telescopically fits about flat bladed upper terminal 18, as illustrated in FIG. 5. The engagement of mounting plate 36 with second electrical support 14 completes the electrical connection of the diode to between the two electrical supports. Mounting plate 36 can be rigidly secured to second electrical support 14 by solder 40; however, mounting plate 36 can also be secured by welding, gluing, clamping, bolting, etc. to second electrical support 14.

Figure 10:
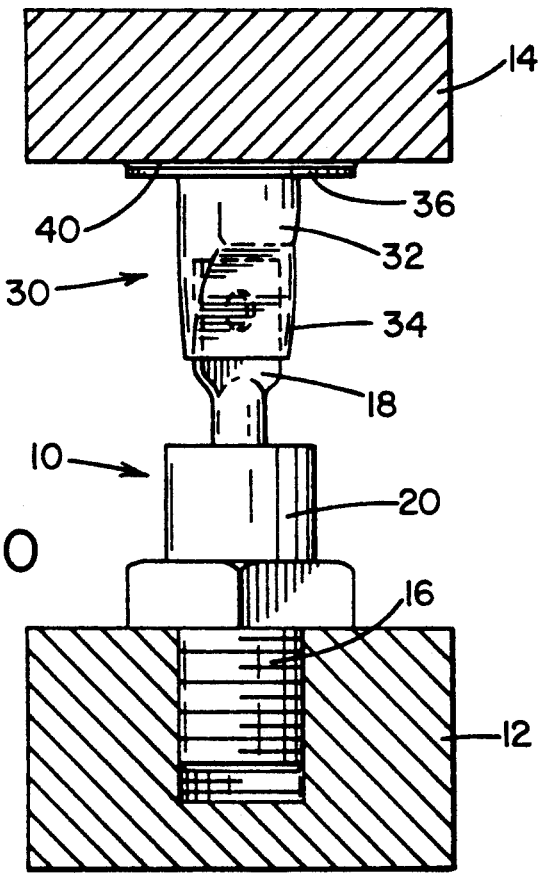
FIG. 10 is a modified embodiment of FIG. 5.

A modification of the preferred embodiment is illustrated in FIG. 10. Once base terminal 16 of diode 10 is mounted onto first electrical support 12, coupler 30 is inserted about upper terminal 18. Before coupler 30 can be inserted, coupler 30 must be rotated until coupler connecting means 34 is aligned with flat bladed upper terminal 18. After coupler 30 is inserted about upper terminal 18 of each diode 10 mounted on first electrical support 12, second electrical support 14 is positioned such that second electrical support 12 is generally parallel to first electrical support 12 and positioned above each coupler 30. Second electrical support 14 can be positioned such that direct contact is made with each coupler 30 or a small space may exist between mounting plate 36 and second electrical support 14. Once second electrical support 14 is positioned, coupler mounting plate 36 is rigidly mounted to second electrical support 14 to form a solid electrical connection between coupler 30 and second electrical support 14. The electrical connection is formed by solder 40, but may also be formed by welding, gluing, clamping, bolting, etc. After mounting plate 36 is connected to second electrical support 14, additional electrical connection means can be provided to engage coupler 30 for providing an additional electrical connection. Such means may include screwing a threaded screw into second electrical support 14 until contact is made between the threaded screw and coupler 30. Other connection means such as wires, bolts, tape, etc. may be used to provide an additional electrical connection.

Although the invention has been described with reference to specific embodiments, variations within the scope of the following claims will be apparent to those skilled in the art.

Having thus described my invention it is claimed:

1. In a mounting assembly for a plurality of bipolar electrical components connected between first and second generally parallel electrical supports, each of said bipolar electrical components having a central axis, a lower base terminal with means for fixedly mounting said lower base terminal to said first electrical support to a random position about said central axis of said component, and a generally flat upper terminal having a random angular orientation to said central axis of said component, a plurality of electrically conducting coupler means for connecting said flat upper terminal of each bipolar electrical component onto said second electrical support, the improvement comprising each of said coupler means including an electrically conducting body connected between a connector means end for telescopically sliding over said component flat upper terminal and a mounting plate of a greater width than the width of said connector means and a conducting body for securing said coupler to said second electrical support having slots, aligned with said component flat upper terminal and a slot width larger than said coupler conducting body and said coupler connector means, whereby said coupler conducting body and said coupler connector means extends through one of said second electrical support slots and said connector means telescopically receives said flat upper terminal while said coupler mounting plate engages said second electrical structure and means for electrically fastening said coupler mounting plate to said second electrical structure.

2. A mounting assembly as defined in claim 1, wherein said means for fixedly mounting said component lower base terminal to said first electrical support is a threaded lower base terminal screwed into said first electrical support.

3. A mounting assembly as defined in claim 1, wherein said means for electrically fastening said coupler mounting plate to said second electrical support is solder.

4. A mounting assembly as defined in claim 3, wherein each of said second electrical slot support has a width smaller than said coupler mounting plate width.

5. A mounting assembly as defined in claim 1, wherein each of said second electrical support slot width is smaller than said coupler mounting plate width.

6. A mounting assembly for mounting bipolar electrical components between first and second generally parallel electrical supports, said assembly comprising a bipolar component having a semiconducting body affixed between a lower base terminal with means for mounting onto said first electrical support and an upper terminal, an electrically conducting coupler means for connecting said component upper terminal to said second electrical support, said coupler having an electrically conducting body attached between a connector means and a mounting plate, said connector means telescopically receiving said component upper terminal to form an electrical connection between said component and said coupler, and means for electrically connecting said coupler mounting plate to said second electrical support.

7. A mounting assembly as defined in claim 6, wherein said second electrical support includes holes of a width for inserting said coupler connector means through said holes and about said component upper terminal.

8. A mounting assembly as defined in claim 7, said coupler mounting plate is of a larger width than said coupler conducting body and said coupler connector means.

9. A mounting assembly as defined in claim 8, wherein the width of the mounting plate is larger than said second electrical support hole width.

10. A mounting assembly as defined in claim 9, wherein said coupler mounting patle is soldered to said second electrical support.

11. A mounting assembly as defined in claim 7, wherein the width of the mounting plate is larger than said second electrical support hole width.

12. A mounting assembly as defined in claim 6, wherein said coupler mounting plate is of a larger width than said coupler conducting body and said coupler connector means.

13. A mounting assembly as defined in claim 6, wherein said coupler mounting plate is soldered to said second electrical support.

14. An electrically conducting coupler for forming an electrical connection between one terminal of a bipolar component and an electrical support comprising an electrical conducting body axially affixed between an electrically connecting connector means and a mounting plate, said connector means having a shape for telescopically receiving said bipolar component terminal forming a secure and generally rigid electrical connection, and said mounting plate of a width at least as large as the width of said coupler body for forming a secure electrical connection to said electrical support.

15. An electrically conducting coupler as defined in claim 14, wherein said mounting plate width is larger than said coupler body width and the width of said coupler connector means.

16. An electrically conducting coupler as defined in claim 15, wherein said secure electrical connection is formed by soldering said mounting plate to said electrical support.

17. An electrically conducting coupler as defined in claim 14, wherein said connector means shape is inserted about a flat bladed terminal of said bipolar component.

18. A method of mounting a plurality of bipolar electrical components between first and second generally parallel electrical supports with use of a coupler, said bipolar component having a central axis and a base terminal and an upper terminal lying along said central axis, said coupler including an electrically conducting body affixed between and an upper mounting plate and a connection means, said method including the steps of:
   a) mounting said component base terminal to said first electrical support whereby said bipolar component is randomly affixed about said component central axis;
   b) inserting said electrically conducting coupler through a hole in said second electrical support whereby said hole being axially aligned with said bipolar component central axis;
   c) telescopically inserting said coupler connecting means about said component upper terminal until said mounting plate engages said second electrical support forming a generally rigid electrical connection between said component and said coupler and an electrical connection between said component and said second electrical support; and d) electrically mounting said coupler mounting plate to said second electrical support.

19. A mounting method of claim 18, including the step of rotating said coupler until said coupler connecting means is aligned with said component upper terminal.

20. The mounting method of claim 18, wherein the width of coupler mounting plate is larger than the width of said coupler connecting means and the width of said coupler conducting body.

21. The mounting method of claim 20, wherein the width of said second electrical support hole is smaller than said coupler mounting plate width.

22. The mounting method of claim 18, wherein said coupler mounting plate is soldered to said second electrical support.

* * * * *